(12) United States Patent
Kern et al.

(10) Patent No.: US 11,861,184 B2
(45) Date of Patent: *Jan. 2, 2024

(54) DETERMINATION OF A RESULTANT DATA WORD WHEN ACCESSING A MEMORY

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/943,536

(22) Filed: Sep. 13, 2022

(65) Prior Publication Data
US 2023/0095070 A1 Mar. 30, 2023

Related U.S. Application Data

(63) Continuation of application No. 17/144,723, filed on Jan. 8, 2021, now Pat. No. 11,455,104.

(30) Foreign Application Priority Data

Jan. 13, 2020 (DE) ..................... 10 2020 100 541.5

(51) Int. Cl.
  *G11C 29/42* (2006.01)
  *G06F 3/06* (2006.01)
(52) U.S. Cl.
  CPC .......... *G06F 3/0622* (2013.01); *G06F 3/0655* (2013.01); *G06F 3/0673* (2013.01); *G11C 29/42* (2013.01)
(58) Field of Classification Search
  CPC .... G06F 3/0622; G06F 3/0655; G06F 3/0673; G11C 29/42; G11C 11/1673; G11C 2013/0054; G11C 13/004

(Continued)

(56) References Cited

U.S. PATENT DOCUMENTS 9,805,771 B2 10/2017 Loibl
2010/0281340 A1 4/2010 Franceschini
(Continued)

FOREIGN PATENT DOCUMENTS

CN 115862713 A * 3/2023 ......... G11C 13/0026
DE 102016003366 A1 9/2016

OTHER PUBLICATIONS

Wikipedia; "Random-access memory"; https://en.wikipedia.org/wiki/Random-access_memory; Last Edited Dec. 28, 2020.
(Continued)

*Primary Examiner* — Michael T Tran
(74) *Attorney, Agent, or Firm* — Eschweiler & Potashnik, LLC (57) ABSTRACT

A method for determining a resultant data word when accessing memory cells includes reading a set of memory cells, and determining first and second data words therefrom. Each memory cell is assigned a component of the first and second data words. The first and second data words for the respective memory cell assume a first value if a first comparison with a first reference value and a second comparison with a second reference value show that the two reference values are greater and assume a second value if the first comparison with the first reference value and the second comparison with the second reference value show that the two reference values are smaller. The first and second data words assume at least one third value if neither condition is satisfied. The resultant data word is determined based on the first or second data words. A corresponding device is also proposed.

14 Claims, 3 Drawing Sheets

(58) Field of Classification Search
USPC .................................................. 365/206, 207
See application file for complete search history.

(56) References Cited

U.S. PATENT DOCUMENTS

| | | |
|---|---|---|
| 2012/0008411 A1 | 1/2012 | Banks |
| 2012/0079331 A1* | 3/2012 | Toda ................... G11C 11/4094 714/719 |
| 2013/0173970 A1* | 7/2013 | Kleveland .............. G11C 29/50 714/710 |
| 2014/0156912 A1* | 6/2014 | Lin ....................... G06F 3/0619 711/103 |
| 2020/0082897 A1* | 3/2020 | Li ........................ G11C 29/883 |
| 2020/0091942 A1* | 3/2020 | Horisaki ................. G11C 16/34 |
| 2020/0218605 A1* | 7/2020 | Subramanian ........ G06F 11/108 |
| 2021/0158867 A1* | 5/2021 | Hara ..................... G06F 3/0619 |
| 2021/0191809 A1* | 6/2021 | Song ................... H01L 25/0652 |
| 2021/0224156 A1* | 7/2021 | Cho ..................... G06F 11/1076 |
| 2021/0313001 A1* | 10/2021 | Jang ...................... G11C 29/38 |
| 2022/0051727 A1* | 2/2022 | Gwak .................. G11C 16/349 |
| 2022/0068366 A1* | 3/2022 | Kwon .................. G11C 7/1045 |
| 2022/0130437 A1* | 4/2022 | Park ...................... G11C 16/349 |
| 2022/0359007 A1* | 11/2022 | Jo ....................... G11C 13/0028 |
| 2023/0054577 A1* | 2/2023 | Chang ................. G11C 11/1673 |
| 2023/0229313 A1* | 7/2023 | Terada .................. G06F 3/0673 711/105 |

OTHER PUBLICATIONS

Notice of Allowance dated May 19, 2022 for U.S. Appl. No. 17/144,723.

* cited by examiner

DETERMINATION OF A RESULTANT DATA WORD WHEN ACCESSING A MEMORY

REFERENCE TO RELATED APPLICATION

This application is a continuation of U.S. application Ser. No. 17/144,723, filed on Jan. 8, 2022, which claims priority to German Application No. 10 2020 100 541.5, filed on Jan. 13, 2020, the contents of which are hereby incorporated by reference in their entirety.

BACKGROUND

Memories with random access (RAM, Random Access Memory) are increasingly being provided, for example as a
static RAM (SRAM)
dynamic RAM (DRAM)
synchronous dynamic RAM (SDRAM, DDR–SDRAM, etc.)
ferroelectric RAM (FRAM, FeRAM),
magnetic RAM (MRAM), phase-change RAM (PRAM, PCRAM) or
resistive RAM (RRAM, Re RAM)
Details of this can be found for example at
https://de.wikipedia.org/wiki/Random-Access Memory.

For example, a memory cell of a memory can represent the states 0 and 1. When reading a memory cell, an analog cell current Icell is determined by means of a read amplifier. In this case, the states 0 and 1 are subject to different cell current distributions (frequency distributions for the cell current). When reading the memory cell, it is therefore intended to determine to which of the distributions the currently determined cell current belongs and whether the memory cell consequently represents the value 0 or the value 1.

Thus, the states 0 and 1 can be different from one another if the distributions do not overlap. A reading window designates a distance or a gap between the distributions. Consequently, the separation of the states 0 and 1 is possible all the better the larger the reading window is.

With a multiplicity of memories, in particular RRAMs, MRAMs, the reading window is much smaller and can change (for example become smaller or shift) over the course of time and/or in dependence on external influences.

SUMMARY

This disclosure improves existing approaches and provides a robust reading concept for memories that also works satisfactorily with small reading windows.

The disclosure comprises a method for determining a resultant data word when accessing memory cells of a memory, comprising:
(a) reading a set of memory cells,
(b) wherein a first data word and a second data word are determined from the read set of memory cells, wherein each memory cell is assigned a component of the first data word and the corresponding component of the second data word,
(c) wherein the first data word and the second data word for the respective memory cell assume a first value if a first comparison with a first reference value and a second comparison with a second reference value show that the two reference values are greater and assume a second value if the first comparison with the first reference value and the second comparison with the second reference value show that the two reference values are smaller,
(d) wherein the first data word and the second data word for the respective memory cell assume at least one third value if the conditions according to feature (c) are not satisfied,
(e) determining the resultant data word on the basis of the first data word or on the basis of the second data word.

In one embodiment, the memory cell is a binary memory cell. Before the reading out, a binary value was written to the memory cell. The read-out value of the memory cell represents a state of the memory cell.

For example, an individual reading operation takes place for determining physical values for the set of memory cells. The physical values are obtained from frequency distributions on which they are based. The physical values determined in the individual reading operation are used to determine at least two data words from them, for example one data word for each reference value.

Correspondingly, further reference values that lead to further data words may be provided. By comparing the individual (same) components of the data words (each component corresponds to a memory cell), the reliability of the memory cell concerned can be concluded.

The first value, second value and third value may be in each case a pair of values or an n-tuple (where n is the number of data words) comprising multiple (binary) values. For example, each of these values may assume one of the values [0, 0], [1, 1], [0, 1] or [1, 0].

In particular, the first reference value may be a smallest reference value and the second reference value may be a greatest reference value. This is of advantage specifically when there are more than two reference values.

The approach proposed here therefore allows error-tolerant handling even of small reading windows. For example, analog values provided by a read amplifier (sense amplifier, SA) can be compared with multiple reference values. Such a comparison may take place in the voltage domain, in the current domain and/or in the time domain.

It is a development that the at least one third value comprises a pair of values with binary values that are different from one another.

It is a development that
the resultant data word is determined by the first data word,
if the first data word is a codeword of an error code or
if the first data word can be corrected by using the error code, or
the resultant data word is determined by the second data word,
if the second data word is a codeword of the error code or
if the second data word can be corrected by using the error code.

The error code C is, in one embodiment, an error-correcting and/or error-detecting code.

It is a development that a specified action is performed if the error of the first data word or of the second data word cannot be corrected by means of the error code.

It is a development that the method also comprises:
carrying out a comparison with a third reference value, which is different from the first reference value and the second reference value,
wherein the components of the first data word and of the second data word are determined in dependence on comparisons with the first reference value, with the second reference value and with the third reference value.

It is a development that, if the conditions according to feature (c) are not satisfied, the first data word and the second data word for the respective memory cell in dependence on a comparison with a further reference value assume at least the third value.

In one embodiment the third value is different from the first value and the second value.

The further reference value may be a third reference value, which is arranged between the first and second reference values. For example, the first reference value may be the smallest reference value and the second reference value the greatest reference value. In this case, the further reference value, as the third reference value, is greater than the first reference value and smaller than the second reference value.

If the value read out from the memory cell lies between the first and second reference values, it can be established by a comparison with the third reference value whether the value read out from the memory cell lies closer to the first reference value or closer to the second reference value. The third value may be determined in dependence on how close the read-out value lies to the first or second reference value. For example, the third value may be a two-component value.

If for example the first value is [0, 0] and the second value is [1, 1], then the third value may be determined as [0, 1] or as [1, 0] in dependence on whether the value read out from the memory cell is smaller or greater than the third reference value.

Alternatively, if the first value is [1, 0] and the second value is [0, 1], then the third value may be determined as [0, 0] or as [1, 1] in dependence on whether the value read out from the memory cell is smaller or greater than the third reference value.

It is a development that
a further data word is determined, wherein each memory cell is assigned a component of the further data word, the further data word is a third data word,
the first data word, the second data word and/or the third data word for the respective memory cell assume according to feature (c) the first value or the second value in a way corresponding to the conditions of feature (c),
the first data word, the second data word and/or the third data word assume the at least one third value if the conditions according to feature (c) are not satisfied,
the resultant data word is determined on the basis of the first data word, the second data word and the third data word.

The first, second and third values are for example in each case a three-component binary value. If for example the first value is [0, 0, 0] and the second value is [1, 1, 1], then the third value may be determined as a three-component binary value that is different from the first value and the second value, for example: [0, 1, 1] or [1, 1, 0].

It is an option that the third value may be determined differently or in the same way for different memory cells.

It is a development that a fourth data word is determined as an XOR operation combining the components of the first, second and third data words.

For example, a fourth component that is determined by an XOR operation on the three previous components may be introduced. If the bits of a three-component value of a data word are [b1, b2, b3], then a fourth bit for this data word is obtained as $b4 = b1 \oplus b2 \oplus b3$ and the data word correspondingly becomes [b1, b2, b3, b4].

If for example the first value for the first, second and third data words is determined as [0, 0, 0] and the second value for the first, second and third data words is determined as [1, 1, 1], then [0, 0, 0, 0] results from this as the first value for the first, second, third and fourth data words and [1, 1, 1, 1] results from this as the second value for the first, second, third and fourth data words, since, as stated above, the fourth component is defined by the three previous components.

If for example [1, 1, 0] applies to the third value for the first, second and third data words of a first memory cell and [0, 1, 0] applies to the third value of a second memory cell, then the third value of the first memory cell for the first, second, third and fourth data words is determined as [1, 1, 0, 0] and the third value of the second memory cell for the first, second, third and fourth data words is determined as [0, 1, 0, 1].

This results in pairs of the first, second, third and fourth components of the third values of the first and second memory cells as: [1, 0], [1, 1], [0, 0] and [0, 1]. These are pairs of the components that correspond to the first and second memory cells for the first data word, for the second data word, for the third data word and for the fourth data word.

It is a development that, in dependence on the previously determined errors, at least one of the reference values is not used in the further reading of memory cells.

It is a development that different read-out memory cells or groups of memory cells are at least partially compared with different reference values.

It is a development that the reading of the set of memory cells takes place after an initialization or a switching on.

It is a development that the value read out for each memory cell has a time dependence and is compared in a time domain with the at least one reference value.

It is a development that, on the basis of steps (c) and (d), a classification of the memory cells with regard to their reliability takes place.

For example, if condition (c) is not satisfied, it can be inferred that the memory cell has a lower reliability than if condition (c) is satisfied.

Also proposed is a device for determining a resultant data word when accessing memory cells of a memory, wherein the device is designed for carrying out the steps of:
(a) reading a set of memory cells,
(b) wherein a first data word and a second data word are determined from the read set of memory cells, wherein each memory cell is assigned a component of the first data word and the corresponding component of the second data word,
(c) wherein the first data word and the second data word for the respective memory cell assume a first value if a first comparison with a first reference value and a second comparison with a second reference value show that the two reference values are greater and assume a second value if the first comparison with the first reference value and the second comparison with the second reference value show that the two reference values are smaller,
(d) wherein the first data word and the second data word for the respective memory cell assume at least one third value if the conditions according to feature (c) are not satisfied,
(e) determining the resultant data word on the basis of the first data word or on the basis of the second data word.

The device may be part of the memory or formed separately from it. In particular, the device may comprise a processing unit that carries out the steps mentioned here. The processing unit may comprise at least one of the following components: a processor, a microcontroller, a circuit, an ASIC, an FPGA or a logic unit. The processing unit may take the form of at least one physical unit. In particular, the processing unit may be distributed over multiple physical units.

The explanations above concerning the method apply correspondingly to the device. The acts of the method described here can be performed by means of the device.

The properties, features and advantages of this disclosure described above and the way in which they are achieved are described below in conjunction with a schematic description of example embodiments that are explained in more detail in conjunction with the drawings. For the sake of clarity, elements that are the same or have the same effect are in this case provided with the same designations.

DETAILED DESCRIPTION

It is proposed to read out digital values from memory cells of a memory with the highest possible reliability by using at least two reference values. The digital values may be binary values (also referred to as bits) or multi-value digital values.

The reliability of the memory cells may vary; in particular, the memory cells may have different states with regard to their reliability (also referred to as reliability states). For example, there is a low probability of a memory cell that is in a first reliability state outputting an erroneous value. Correspondingly, there is a high probability of the memory cell in a second reliability state providing an erroneous value when reading out. Thus, in the second reliability state, the memory cell may output the value 0 or 1 with a probability of 50% respectively and, in the first reliability state, the memory cell may output an erroneous value with a much lower probability.

When reading out n memory cells $Sp1, \ldots, Spn$, a first data word $$W^1 = x^1_1, \ldots, x^1_n$$

with n components $x^1_1, \ldots, x^1_n$ (also referred to as bits) and a second data word $$W^2 = x^2_1, \ldots, x^2_n$$

with n components $x^2_1, \ldots, x^2_n$ may be determined.

In another example, more than two data words may also be determined when reading out the memory cells.

The memory cells $Sp1, \ldots, Spn$ may have been described with the bits $x1, \ldots, xn$.

It is an option that a codeword of an error code C comprises the bits $x1, \ldots, xn$. For example, the bits $x1, \ldots, xn$ may form a codeword together with address bits and/or bits derived from address bits.

In particular, the bits $x1, \ldots, xn$ may form a codeword of the error code C. The error code C may be an error-correcting code and/or error-detecting code.

It is assumed below by way of example that the bits $x1, \ldots, xn$ form a codeword of the error code C.

The first data word W1 and the second data word W2 produce a resultant data word Wr as follows:

$$W^r = x^r_1, \ldots, x^r_n.$$

For $i = 1 \ldots, n$, two reference values $$Ri- \text{ and } Ri+$$

with $$Ri- < Ri+ \text{ and } Ri+ - Ri- = \Delta i > 0$$

are used when reading out a memory cell Spi.

The memory cell Spi has a physical value Vi, which is for example electrical resistance. A reading current determined by the resistance of the memory cell may for example be compared both with the first reference value Ri− and with the second reference value Ri+.

A first digital value αi can be determined by the reading current being smaller or greater than the first reference value Ri−. The second digital value βi may be determined by the reading current being smaller or greater than the second reference value Ri+.

For example, the one reading current determined when reading out the memory cell Spi is compared both with the reference value Ri− for determining the first digital value αi and with the second reference value Ri+ for determining the second digital value βi. In this example, αi and βi are binary values.

It is an option that more than two reference values, for example three reference values $$Ri-, Ri, Ri+,$$

are used, with which a physical value determined when reading out the memory cell Spi is compared. The physical value may be for example a reading current, a charge or a voltage (for example associated with the reading current).

Optionally, a word derived from the state of the memory cell may be compared with at least two reference values, in order in this way to determine at least two digital values.

Different approaches for determining a binary value when reading out a memory cell by using reference values are known. It is known from the document U.S. Pat. No. 9,805,771 that a binary value can be determined in a time domain when reading out memory cells.

For example, a reading current of a memory cell may be integrated by way of a capacitance. Similarly, a current that corresponds to a reference value may be integrated by way of a capacitance and it can be determined whether the integral of the reading current reaches a threshold value before the integral of the current of the reference value or whether the integral of the reading current reaches the threshold value after the integral of the current of the reference value. If the integral of the current of the read-out memory cell reaches the threshold value at a time before the integral of the current of the reference value, a first digital value can be determined for the memory cell when reading. If the integral of the current of the read-out memory cell reaches the threshold value at a time after the integral of the current of a reference value, a second digital value can be determined for the memory cell when reading.

A comparison of a state stored in a memory cell with multiple reference values can be correspondingly carried out.

When reading out a memory cell Spi, the read-out physical value or a value derived from the physical value can be compared both with the first reference value and with the second reference value without a further reading out of this physical value taking place.

The read-out value may also be an indirectly read-out value, for example a value that was determined from the read-out value.

A location or a position of the read-out value in relation to the first reference value and in relation to the second reference value can be determined.

It is consequently established whether the read-out value is greater or smaller than the first and/or second reference value. If it is a comparison in the time domain, it can be determined whether and if so which reference value is reached earlier or later.

A read-out value of the memory cell Spi is compared with the first and second reference values. In this case, values $x^1_i$ and $x^2_i$ of an ith component of the first data word W1 and of the second data word W2 are determined as follows:

If the read-out value is greater than the first reference value and greater than the second reference value, the components $x^1_i$ and $x^2_i$ of the two data words W1 and W2 are equal and have a first value.

If the read-out value is smaller than the first reference value and smaller than the second reference value, the components $x^1_i$ and $x^2_i$ of the two data words W1 and W2 are equal and have a second value, which is different from the first value.

If the read-out value is greater than the first reference value and smaller than the second reference value, or the read-out value is smaller than the first reference value and greater than the second reference value, the components $x^1_i$ and $x^2_i$ are unequal or inverse to one another. For example, one of the values may be 0 and the other 1.

If the memory cell Spi has been described with a 1 for example and the value read out from the memory cell is positioned between the first and second reference values, then one of the values $x^1_i$ or $x^2_i$ is equal to 1. Irrespective of whether a correct or an erroneous physical value was read out when reading out the memory cell Spi, in one of the two data words W1 and W2 the ith component is correct.

Figure 1:
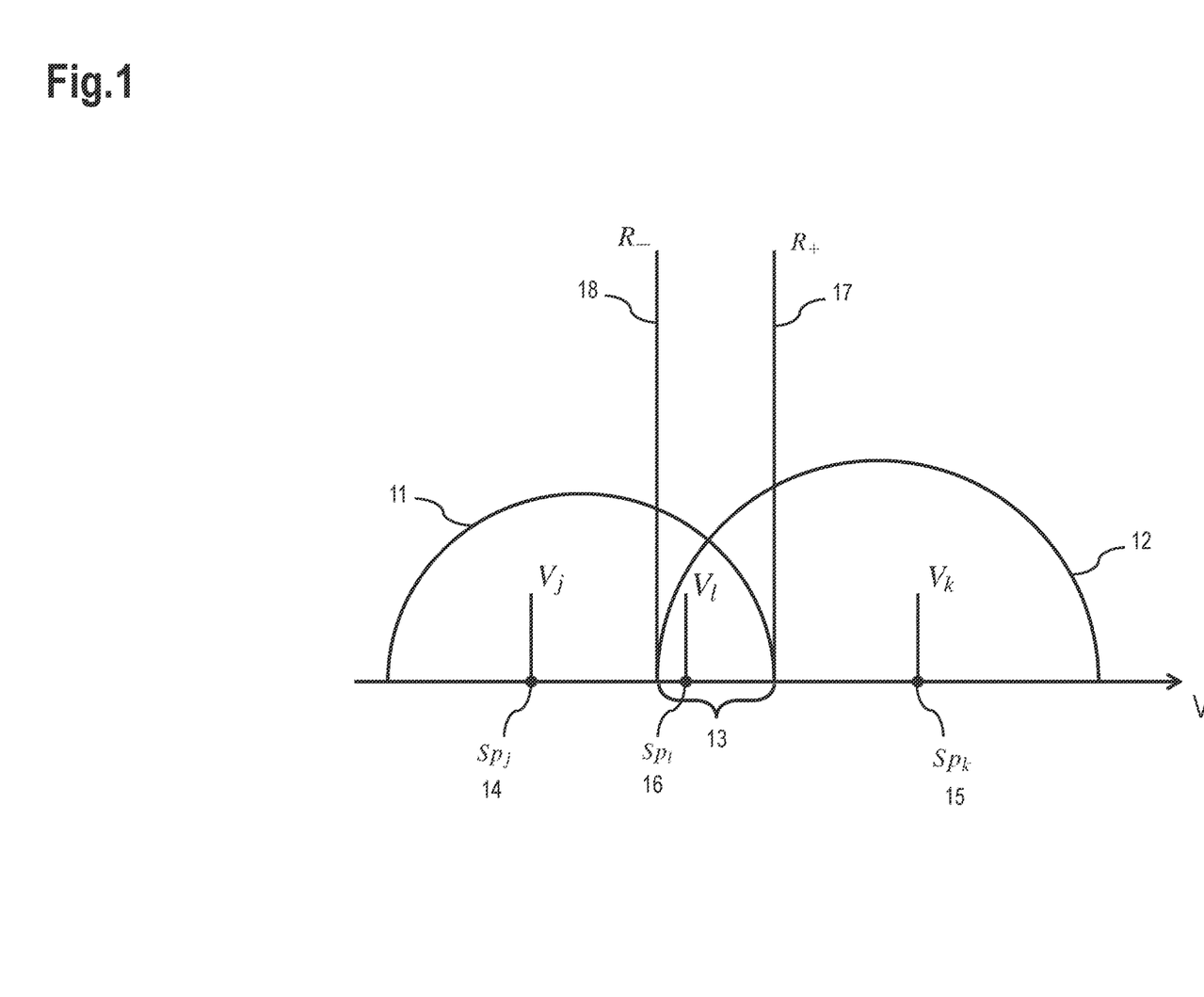
FIG. 1 shows a schematic diagram with distributions of physical values for memory cells of a memory and also two reference values.

For further explanation, reference should be made to FIG. 1.

The bits x1, . . . ,xn to be stored, which are bits of a codeword of an error code C, are written to the memory cells Sp1, . . . ,Spn.

It is an option that the bits x1, . . . ,xn together with further bits are a codeword of the error code C. The further bits may be address bits or bits derived from address bits. The address is preferably the address at which the bits x1, . . . ,xn are/have been stored in the memory.

For example, the address may be provided by an address generator as a write address when writing and as a read address when reading.

It is also an option that the further bits comprise a password, which for example is checked when writing and/or when reading.

The error code C may be a Hsiao code. For example, the error code C may be a 1-bit error-correcting and 2-bit error-detecting code or a 2-bit error-correcting and 3-bit error-detecting BCH code.

As mentioned above, when reading out the memory cells Sp1, . . . , Spn, the first data word W1 and the second data word W2 may be determined. The first data word W1 is either a codeword of the error code C or not a codeword of the error code C.

Correspondingly, the second data word W2 is either a codeword of the error code C or not a codeword of the error code C.

If the first data word W1 is a codeword of the error code C, it can be used in the resultant data word Wr.

If the first data word W1 is not a codeword of the error code C and differs from a codeword of the error code C in erroneous bits, so that there is a correctable error of the code C, then the data word W1 is corrected to a corrected data word W1,cor. The corrected first data word W1,cor can be used in the resultant data word Wr.

If for example the first data word W1 differs from a codeword of the error code C in precisely one bit, then there is a 1-bit error. If the error code is a Hsiao code, this 1-bit error in the first data word W1 can be corrected to the corrected first data word W1,cor.

If the first data word W1 is not a codeword of the error code C and differs from each codeword of the error code C in bits that form an error of the error code C that cannot be corrected, the first data word W1 is marked as uncorrectable.

If the second data word W2 is not a codeword of the error code C and differs from a codeword of the error code C in erroneous bits, so that there is a correctable error of the code C, then the data word W2 is corrected to a corrected second data word W2,cor. The corrected second data word W2,cor can then be used in the resultant data word Wr.

If the second data word W2 is not a codeword of the error code C and differs from each codeword of the error code C in bits that form an error of the error code C that cannot be corrected, the second data word W2 is marked as uncorrectable.

An error may occur in the bits of the first data word for example if an ith bit $x^1_i$ for which the two digital values αi and βi are equal and which is determined as $x^1_i=αi=βi$ is erroneous. If such an error occurs with a low probability, the memory cell Spi is in a reliable state.

An error may occur in the bits of the first data word for example if a jth bit $x^1_j$ for which the two digital values αj and βj are unequal and which is determined as $x^1_j$ is erroneous. The binary value 0 of the first data word is for example determined for all memory cells for which the corresponding first digital value is unequal to the second digital value. The component $x^2_j$ of the second data word W2 is then equal to 1.

The memory cell Spj is in an unreliable state. In its unreliable state, the memory cell Spj outputs the binary value 0 or the binary value 1 for example with a probability of 50% respectively. One of the output values is correct, the other is erroneous.

Since the component $x^1_j$ of the first data word is equal to 0 and the component $x^2_j$ of the second data word W2 is equal to 1, either the corresponding component of the first data word or the corresponding component of the second data word is error-free.

If in an example only a few memory cells are in an unreliable state, there is a low probability pu that a memory cell is in an unreliable state. The memory cell in the unreliable state in this case outputs an erroneous value with a probability of ½ ·pu.

FIG. 1 shows distributions of physical values V for memory cells of a memory. A distribution 11 is assigned to a binary value 1 and a distribution 12 is assigned to a binary value 0. The distributions 11 and 12 overlap in an overlapping region 13.

Also shown are a reference value R+ 17 and a reference value R− 18, where R+−R−>0.

For a memory cell Spi with i=1, ..., n, a first digital value α1 is obtained as $$\alpha_i = \begin{cases} 1 & \text{for } V_i \leq R_- \\ 0 & \text{for } V_i > R_- \end{cases},$$

and a second digital value β1 is obtained as $$\beta_i = \begin{cases} 1 & \text{for } V_i \leq R_+ \\ 0 & \text{for } V_i > R_+ \end{cases}.$$

It should be assumed below that the reference values for three memory cells Spj 14, Spk 15 and Spl 16 (j≠k≠l) under consideration are equal. By way of example, three physical values Vj, Vk and Vl are respectively compared with the reference values 17 and 18.

The physical value Vj of the memory cell Spj 14 is smaller than each of the reference values 17 and 18. The digital values are consequently obtained as αj=βj=1. It follows from this that $x^1_j = x^2_j = 1$ for the jth bit $x^1_j$ of the first data word W1 and for the jth bit $x^2_j$ of the second data word W2.

The physical value Vj does not lie in the overlapping region 13. The digital values αj and βj of the memory cell Spj 14 are both equal to 1. The memory cell Spj 14 may be regarded as reliable; there is only a low probability that a reading error should be expected when reading out the memory cell Spj 14.

The physical value Vk of the memory cell Spk 15 is greater than each of the reference values 17 and 18. The digital values are consequently obtained as αk=βk=0. It follows from this that $x^1_k = x^2_k = 0$ for the kth bit $x^1_k$ of the first data word W1 and for the kth bit $x^2_k$ of the second data word W2.

The physical value Vk does not lie in the overlapping region 13. The digital values αk and βk of the memory cell Spk 15 are both equal to 0. The memory cell Spk 15 may be regarded as reliable; there is only a low probability that a reading error should be expected when reading out the memory cell Spk 15.

The physical value Vl of the memory cell Spl 16 is greater than the reference value 18 and smaller than the reference value 17. The digital values are consequently obtained as αl=0≠βl=1. It follows from this that $x^1_l = 0$ for the lth bit $x^1_l$ of the first data word W1 and $x^2_l = 1$ for the lth bit $x^2_l$ of the second data word W2.

The physical value Vl lies in the overlapping region 13. There is a greater probability that a reading error should be expected when reading out the memory cell Spl 16 than when reading out the memory cells Spj 14 and Spk 15. The memory cell Spl may be regarded as unreliable.

If there is no error in the n-1 components $$x^1_1, \ldots, x^1_{l-1}, x^1_{l+1}, \ldots, x^1_n$$

of the first data word W1 and in the n-1 components $$x^2_1, \ldots, x^2_{l-1}, x^2_{l-1}, \ldots, x^2_n$$

of the second data word W2, then either the first data word W1 or the second data word W2 is a codeword of the error code C.

The first data word W1 and the second data word W2 differ in the bits $x^1_l$ of W1 and $x^2_l$ of W2. Since αl≠βl, $x^1_l = 0$ and $x^2_l = 1$ were set. Either xl=0 or xl=1 was written to the memory cell Spl.

If xl=0 was written to the memory cell Spl 16, then W1 is error-free and a codeword of the error code C. If xl=1 was written to the memory cell Spl 16, then W2 is error-free and a codeword of the error code C.

If W1 is error-free and a codeword of the error code C, then the resultant data word Wr is determined as W1. If W2 is error-free and a codeword of the error code C, then the resultant data word Wr is determined as W2.

By way of example, it is assumed that xl=0 was written to the memory cell Spl 16 and that consequently W1 is error-free and a codeword of the error code C.

If then in addition a further bit, for example the first bit with 1≠l is erroneous both in W1 and in W2, although $x^1_l = x^2_l$ and αl=βl, then the first data word W1 has a 1-bit error in the first bit. The second data word W2 has a 2-bit error, with the first bit and the Ith bit being erroneous.

If then for example the error code C is a known 1-bit error-correcting and 2-bit error-detecting Hsiao code, then the first data word W1 can be corrected by using the code C.

Correspondingly, the erroneous first data word W1 can be corrected to the first corrected data word W1,cor by using the Hsiao code.

The second data word W2 cannot be corrected by using the error code C assumed here by way of example. On account of the 2-bit error present in W2, the erroneous second data word is detected as not correctable by the error code C, which is by way of example a 1-bit error-correcting and 2-bit error-detecting Hsiao code.

The resultant data word Wr is then equal to W1,cor.

If for example the error code C is a 2-bit error-correcting and 3-bit error-detecting BCH code, the first data word W1, which has a 1-bit error in the first bit, is corrected to the corrected first data word W1,cor. Also the second data word W2, which has a 2-bit error in the first bit and in the Ith bit, is corrected by the error code C to the second corrected data word W2,cor. The resultant data word Wr is in this case determined as Wr=W1,cor=W2,cor.

If, however, for example a 2-bit error additionally occurs in the first and second bits both in the first data word W1 and in the second data word W2, and if l≠1, 2, this 2-bit error in the first data word W1 can be corrected to the corrected first data word W1,cor. By contrast, the second data word has 3-bit errors in the first, second and Ith bits, which cannot be corrected by the error code C. The erroneous second data word W2 is detected as not correctable. The resultant data word Wr is obtained as Wr=W1,cor.

In another example it is assumed that the fifth bit position and the seventh bit position of the corresponding digital values are unequal, and therefore α5≠β5 and α7≠β7. For the first data word W1, x5=x7=0 is then determined, and for the second data word W2, x5=x7=1 applies.

The bits x5 and x7 were written to the memory cells Sp5 and Sp7. There are four possible assignments of the bits x5 and x7, which can be distinguished as follows:

x5=x7=0: the first data word W1 in the bits $x^1_5$ and $x^1_7$ is error-free x5=x7=1: the second data word W2 in the bits $x^2_5$ and $x^2_7$ is error-free x5=0 and x7=1: both the first data word W1 has a 1-bit error in the bits $x^1_5$ and $x^1_7$ and the second data word W2 has a 1-bit error in the bits $x^2_5$ and $x^2_7$ x5=1 and x7=0: both the first data word W1 has a 1-bit error in the bits $x^1_5$ and $x^1_7$ and the second data word W2 has a 1-bit error in the bits $x^2_5$ and $x^2_7$.

Dependent on which values have been written to the memory cells Sp5 and Sp7 and irrespective of whether bits read out from these memory cells are erroneous or correct, it applies that: either one of the data words W1 or W2 is error-free in the corresponding bits $x^1_5$ and $x^1_7$ or in the bits $x^2_5$ and $x^2_7$, or both data words have a 1-bit error in these bits. Either no error or at most a 1-bit error occurs in one of the data words, so that in at least one of the data words the number of errors can be reduced by at least one error.

Figure 2:
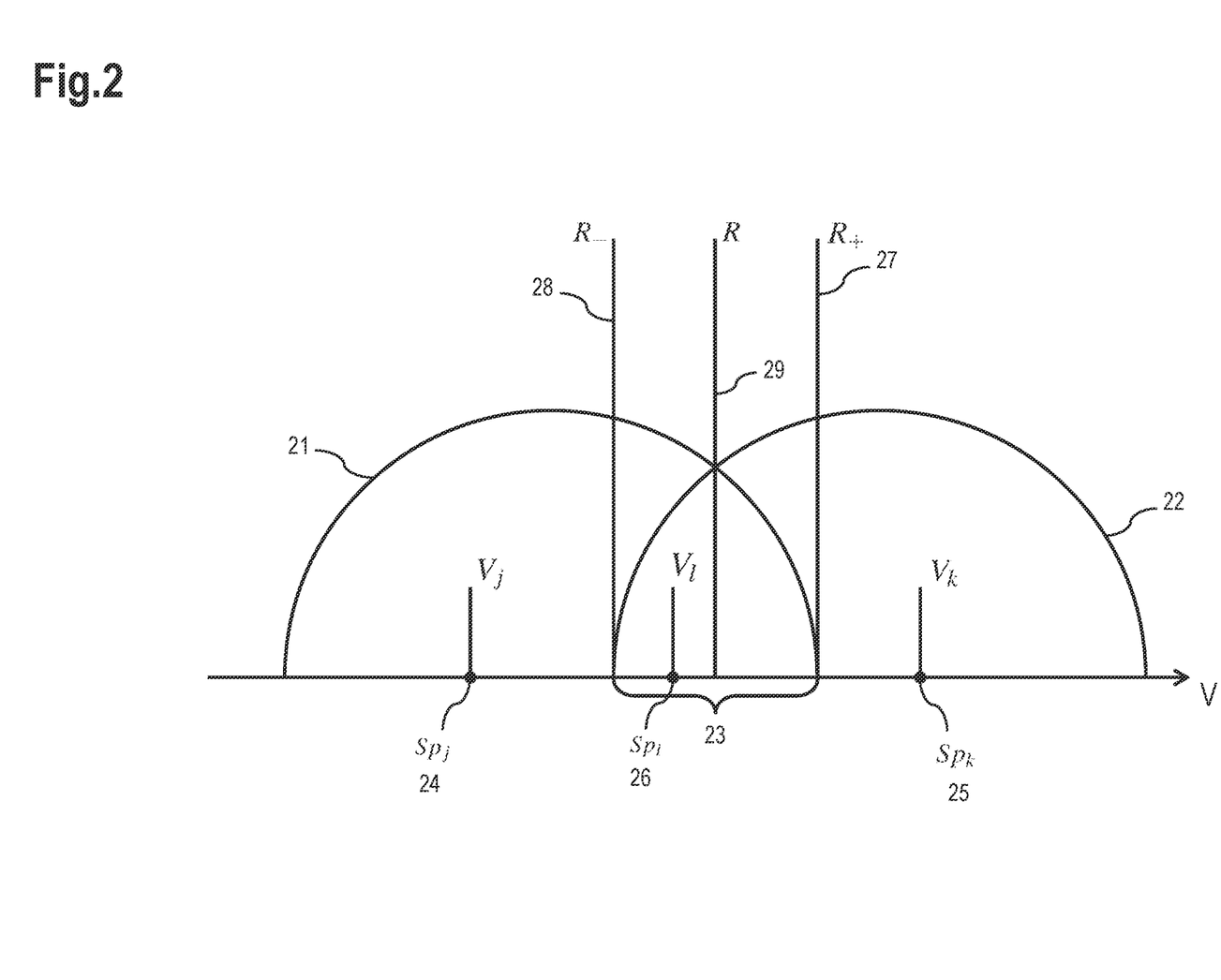
FIG. 2 shows a schematic diagram with distributions of physical values for memory cells of a memory and also three reference values.

FIG. 2 shows distributions of physical values V for memory cells of a memory. One distribution 21 is assigned to a binary value 1 and one distribution 22 is assigned to a binary value 0. The distributions 21 and 22 overlap in an overlapping region 23.

Also shown are a reference value R+ 27, a reference value R− 28 and a reference value R 29, where R+>R>R−>0.

The reference value R− 28 may be referred to as the left reference value, the reference value R 29 may be referred to as the middle reference value and the reference value R+ 27 may be referred to as the right reference value.

Three memory cells Spj 24, Spk 25 and Spl 26, with their corresponding physical values Vj, Vk and Vl, are considered. These may be physical states of the memory cells or states derived from the physical states of the memory cells.

For the sake of simplification, it is assumed below that the reference values 27 to 29 for all three memory cells 24 to 26 are equal. However, examples that provide at least partially different reference values are also possible.

The comparison of each physical value with three reference values allows three binary digital values to be determined for each of the memory cells as follows:

For the memory cell Spj 24 with the physical value Vj, the digital values $\alpha j$, $\beta j$ and $\gamma j$ are determined by $$\alpha_j = \begin{cases} 1 & \text{for } V_j \leq R_- \\ 0 & \text{for } V_j > R_- \end{cases},$$

$$\beta_j = \begin{cases} 1 & \text{for } V_j \leq R_+ \\ 0 & \text{for } V_j > R_+ \end{cases},$$

$$\gamma_j = \begin{cases} 1 & \text{for } V_j \leq R \\ 0 & \text{for } V_j > R \end{cases}.$$

For the memory cell Spk 25 with the physical value Vk, the digital values $\alpha k$, $\beta k$ and $\gamma k$ are determined by $$\alpha_k = \begin{cases} 1 & \text{for } V_k \leq R_- \\ 0 & \text{for } V_k > R_- \end{cases},$$

$$\beta_k = \begin{cases} 1 & \text{for } V_k \leq R_+ \\ 0 & \text{for } V_k > R_+ \end{cases},$$

$$\gamma_k = \begin{cases} 1 & \text{for } V_k \leq R \\ 0 & \text{for } V_k > R \end{cases}.$$

For the memory cell Spl 26 with the physical value Vl, the digital values $\alpha l$, $\beta l$ and $\gamma l$ are determined by $$\alpha_l = \begin{cases} 1 & \text{for } V_l \leq R_- \\ 0 & \text{for } V_l > R_- \end{cases},$$

$$\beta_l = \begin{cases} 1 & \text{for } V_l \leq R_+ \\ 0 & \text{for } V_l > R_+ \end{cases},$$

$$\gamma_l = \begin{cases} 1 & \text{for } V_l \leq R \\ 0 & \text{for } V_l > R \end{cases}.$$

It is evident from FIG. 2 that:

$$\alpha j = \beta j = \gamma j = 1,$$

$$\alpha k = \beta k = \gamma k = 0,$$

$$\alpha l = 0, \beta l = \gamma l = 1.$$

If a first data word $W^1 = x^1_l, \ldots, x^1_n$ and a second data word $w^2 = x^2_l, \ldots, x^2_n$ are provided, then one option for $i=1, \ldots, n$ is to determine the bits $x^1_i$ of the first data word and the bits $x^2_i$ of the second data word such that the following applies:

that $$x^1_i = x^2_i = \alpha_i \text{ for } \alpha_i = \beta_i,$$

and that $$x^1_i = \gamma_i \text{ and } x^2_i = \bar{\gamma}_i \text{ for } \alpha_i \neq \beta_i.$$

For the memory cell Spj 24, $\alpha j = \beta j = 1$, and the memory cell is in a reliable state. The jth component $x^1_j$ of the first data word W1, and the jth component $x^2_j$ of the second data word W2 are equal and equal to $\alpha j = \beta j$.

For the memory cell Spk 25, $\alpha k = \beta k = 0$, and the memory cell is in a reliable state. The kth component $x^1_k$ of the first data word W1, and the kth component $x^2_k$ of the second data word W2 are equal and equal to $\alpha k = \beta k$.

For the memory cell Spl 26, $\alpha l \neq \beta l$, and the memory cell is in an unreliable state. Its corresponding physical value Vl lies in the overlapping region 23 of the distributions 21 and 22. The lth component $x^1_l$ of the first data word W1 is equal to $\gamma 1$ and the lth component $x^2_l$ of the second data word W2 is equal to $\bar{\gamma}_1$. The lth component of the first data word and of the second data word are unequal and inverse to one another.

It is an option to use a first data $word^1 = x^1_l, \ldots, x^1_n$, a second data word $W^2 = x^2_l, \ldots, x^2_n$, a third data word $W^3 = x^3_l, \ldots, x^3_n$ and a fourth data word $w^4 = x^4_l, \ldots, x^4_n$ and to determine the bits for the data words W1, W2, W3 and W4 and for $i=1, \ldots, n$ the bits $x^1_i, x^2_i, x^3_i, x^4_i$ for example in the following way:

$$x^1_i = x^2_i = x^3_i = x^4_i = \alpha_i \text{ for } \alpha_i = \beta_i$$

and $$x^1_i = 0, x^2_i = 1, x^3_i = \bar{\gamma}_i, x^4_i = \gamma_i \oplus 1 \text{ for } \alpha_i \neq \beta_i.$$

It then applies for $i=1, \ldots, n$ that $$x^4_i = x^1_i \oplus x^2_i \oplus x^3_i,$$

so that the components of the fourth data word W4 are equal to an exclusive-OR sum (also referred to as an XOR sum) of the corresponding components of the data words W1, W2 and W3.

If for example a memory cell SpK with $1 \leq K \leq n$ is a first memory cell, which is in an unreliable state, so that $\alpha K \neq \beta K$ applies, and if a memory cell SpL with $1 \leq K < L \leq n$ is a second memory cell, which is in an unreliable state, so that $\alpha L \neq \beta L$ applies, then it is advantageous if tuples $$[x^1_K, x^1_L], [x^2_K, x^2_L], [x^3_K, x^3_L], [x^4_K, x^4_L]$$

of the bits of the data words W1, W2, W3 and W4 are determined such that these tuples form all four possible binary tuples.

For the first memory cell SpK in an unreliable state, for example $x^1_K, x^2_K, x^3_K, x^4_K$ are determined as $$x^1_K = 0, x^2_K = 1, x^3_K = 0, x^4_K = 1$$

For the second memory cell SpL in an unreliable state, for example
$x^1_L, x^2_L, x^3_L, x^4_L$ are determined as $$x^1_L=0, x^2_L=1, x^3_L=1, x^4_L=0$$

It then applies that $$[x^1_K, x^1_L]=[0,0],$$

$$[x^2_K, x^2_L]=[1,1],$$

$$[x^3_K, x^3_L]=[0,1],$$

$$[x^4_K, x^4_L]=[1,0]$$

and each of the four possible tuples [0, 0], [1, 1], [0, 1] and [1, 0] occurs in one of the four data words.

If one of the data words W1, W2, W3 and W4 is a codeword of the error code C used, then this codeword can be determined as the resultant data word Wr. If one of the data words W1, W2, W3 and W4, for example W2, is an erroneous data word that can be corrected to a codeword W2,cor of the code C by using the error code C, then the codeword W2,cor can be used as the resultant data word Wr=W2,cor.

The case where the memory cells SpK and SpL are the only two memory cells of the memory cells Sp1, . . . ,Spn that are unreliable is considered by way of example. The digital values γK and γL form the tuple [γK, γL].

In one of the four data words W1, W2, W3 and W4, one of the tuples $[x^1_K, x^1_L]=[0,0]$, $[x^2_K, x^2_L]=[1,1]$, $[x^3_K, x^3_L]=[0,1]$, $[x^4_K, x^4_L]=[1,0]$ is equal to the tuple [xK, xL] of the bits xK, xL which have been written to the memory cells SpK and SpL, irrespective of which binary values have been erroneously or correctly output by the memory cells SpK and SpL in an unreliable state.

For example, for xK=1, xL=1, the second data word W2 is a codeword of the error code C if no error has occurred in the n-2 bits $$x^2_1, \ldots, x^2_{K-1}, x^2_{K+1}, \ldots, x^2_{L-1}, x^2_{L+1}, \ldots, x^2_n.$$

An error in one of these n-2 bits of the second data word W2 can then be corrected as a 1-bit error, irrespective of the fact that two memory cells are in an unreliable state and independently of the erroneous or correct binary values output by these two memory cells.

Example: Reading Out Memory Cells, Evaluation in the Time Domain

Reading out of memory cells in the time domain by using multiple reference values is described below by way of example. By way of example, three memory cells Sp1, Sp2 and Sp3 and two different reference values R− and R+ are considered.

Dependent on the state of the memory cell Sp1, a derived value v1(t) is determined. The derived value v1(t) is a binary, time-dependent value. Up to a point in time τ1, it assumes the value 0 and as from the point in time τ1 it assumes the value 1.

For example, the state of the memory cell Sp1 may be determined by an electrical resistance value R1. In dependence on the resistance value R1, a reading current I1 is determined when reading out the memory cell Sp1. The reading current I1 can be integrated by using a capacitance Ca over time in relation to a voltage V1(t), which is compared by means of a comparator with a threshold value of a voltage V. At the input of the comparator, the binary time-dependent value v1(t) is provided. As long as the voltage V1(t) is ≤V, then v1(t)=0. If the voltage V1(t) is >V, then v1(t)=1.

Correspondingly, a binary derived value v2(t), which up to a point in time τ2 assumes the value 0 and as from the point in time τ2 assumes the binary value 1, is determined when reading out the memory cell Sp2.

Also, a binary derived value v3(t), which up to a point in time τ3 assumes the value 0 and as from the point in time τ3 assumes the binary value 1, is determined when reading out the memory cell Sp3.

Furthermore, a binary derived value r−(t), which up to a point in time τ− assumes the value 0 and as from the point in time τ− assumes the binary value 1, is determined for the reference value R−.

In addition, a binary derived value r+(t), which up to a point in time τ+ assumes the value 0 and as from the point in time τ+ assumes the binary value 1, is determined for the reference value R+.

Figure 3:
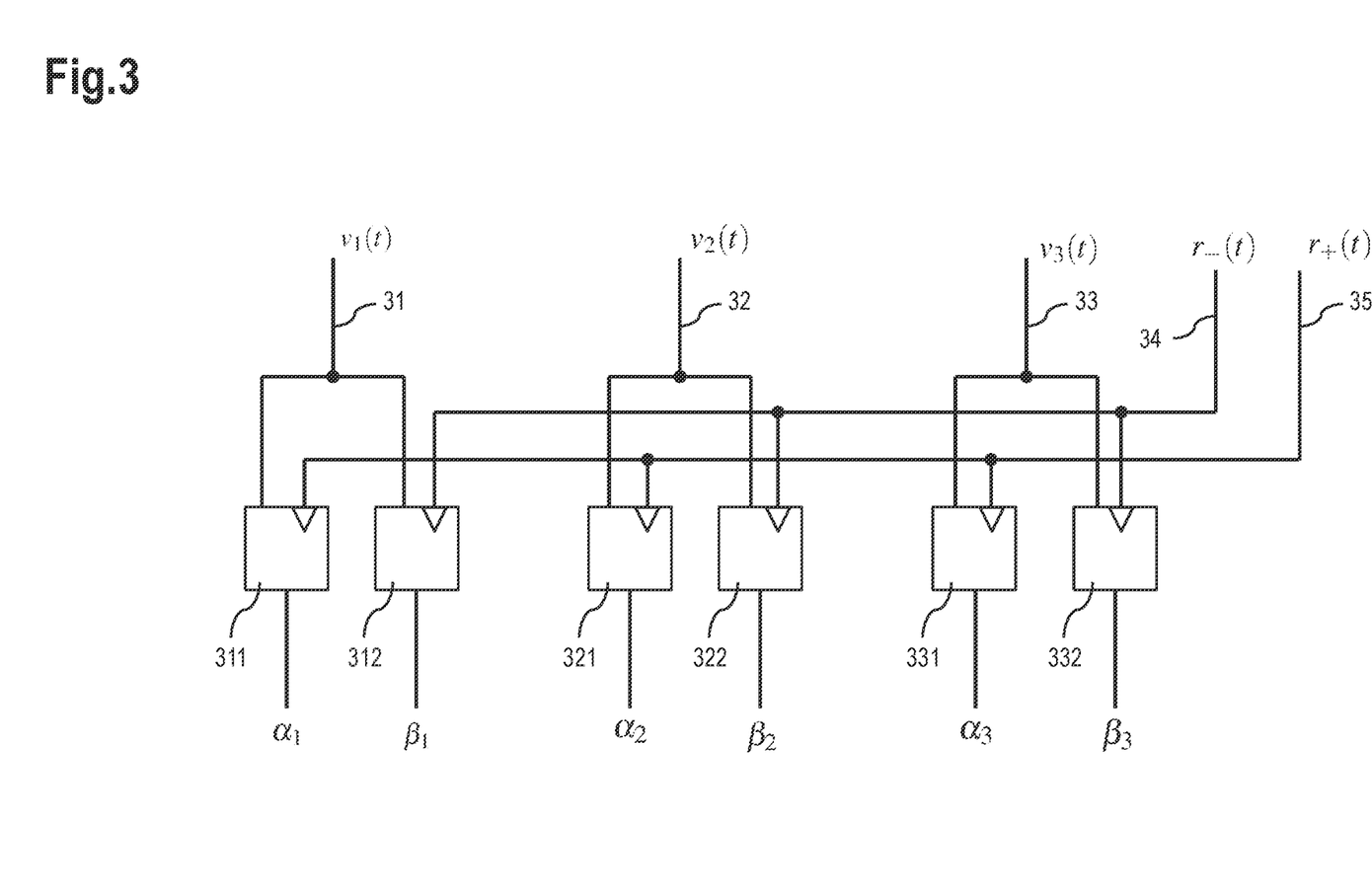
FIG. 3 shows a schematic circuit arrangement with latches for determining digital values in the time domain.

FIG. 3 shows a circuit arrangement with 6 latches 311, 312, 321, 332, 331 and 332. Each of the latches comprises a data input, an input for the input of a hold signal and a data output. Also represented in FIG. 3 are five inputs 31 to 35, wherein at the input 31 there is a binary signal v1 (t), at the input 32 there is a binary signal v2(t), at the input 33 there is a binary signal v3(t), at the input 34 there is a binary signal r−(t) and at the input 35 there is a binary signal r+(t).

The input 31 is connected to the data inputs of the latches 311 and 312, the input 32 is connected to the data inputs of the latches 321 and 322 and the input 33 is connected to the data inputs of the latches 331 and 332.

The input 34 is connected to the hold-signal inputs of the latches 312, 322 and 332 and the input 35 is connected to the hold-signal inputs of the latches 311, 321 and 331.

The value α1 is provided at the output of the latch 311, the value β1 is provided at the output of the latch 312, the value α2 is provided at the output of the latch 321, the value β2 is provided at the output of the latch 322, the value α3 is provided at the output of the latch 331 and the value β3 is provided at the output of the latch 332.

If the hold signal of a latch assumes the value 1, the value at the data input of the respective latch is stored in the latch.

If for example τ−<τ1, then the value 0 is stored in the latch 311. The hold signal r−(t) is equal to 1 before the signal v1 (t) at the data input assumes the value 1. If τ+<τ1, then the value 0 is likewise stored in the latch 312 and it is the case that α1=β1.

If τ−<τ1, then the value 0 is stored in the latch 311. If τ+<τ1, then the value 1 is stored in the latch 312 and it is the case that α1≠β1.

The further values stored in the latches are determined analogously. The content of the latches is determined on the basis of the τime sequence in which the binary signals v1 (t), v2(t), v3(t), r−(t) and r+(t) assume the value 1. The content of the latches also determines the values α1, β1, α2, β2, α3 and β3.

If n memory cells are read out, then, with two reference values, 2·n latches can be used. If N>2 reference values are used, then N·n latches can be used.

Determination of a Reference Value from a Set of Reference Values

How at least one reference value can be determined from a set of reference values is described below by way of example.

By way of example, five reference values

R− −,R−,R,R+,R++ with

R− −>R−>R>R+>R++ form a set of reference values.

It is an option when reading out from memory cells to compare a physical value determined when reading out, or a value derived from the physical value, with the reference values R− and R+, to determine digital values and to form a first data word W1(R−, R+) and a second data word W2(R−, R+).

If the first data word W1(R−, R+) is error-free or can be corrected by using the error code considered, then the first data word, or if applicable the corrected first data word, can be used as the resultant data word Wr(R−, R+).

If the second data word W2(R−, R+) is error-free or can be corrected by using the error code considered, then the second data word, or if applicable the corrected second data word, can be used as the resultant data word Wr(R−, R+).

The memory cells may be part of an addressable memory. For example, memory cells of a first memory area, which is determined by a first address area, may be read out by using the reference values R− and R+. In this case it may be determined how many errors have occurred when reading out the memory cells by using reference values R− and R+. For example, it may be determined how many reading operations at a reading address of the chosen memory area lead to an error that could not be corrected by using the error code.

It is an option to read out memory cells of a second memory area, which can be determined by a second address area, by using the two reference values R− − and R, to form a first data word W1(R− −, R), a second data word W2(R− −, R) and a resultant data word Wr(R− −, R), as described above for the reference values R− and R+.

In this case it can be determined how many errors have occurred when reading out the memory cells of the second memory area by using reference values R− − and R. For example, it may be determined how many reading operations at the reading address of the chosen memory area lead to an error that could not be corrected by using the error code.

Further reference values or combinations of reference values may be respectively used for further memory areas when reading out and it may be determined how many errors cannot not be corrected by the error code.

It is a further option to use those reference values or those combinations of reference values which have for example led to a minimum number of errors that cannot be corrected when reading out from memory cells at a subsequent time.

It is also an option to determine for the various memory areas the number of unreliable cells occurring when reading out.

If an addressable memory is used for example in a motor vehicle, the reading out of various memory areas and the determining of suitable reference values or combinations of reference values may take place when switching on or initializing (powering up). The determined reference value or the determined combination of reference values can be used during subsequent operation. Such an approach to determining the reference values may be advantageous if the distributions of the physical values that correspond to the stored values 1 and 0 change due to temperature influences or due to a loss of charge over time. The reference values used may also be dynamically adapted to the changing physical state of the memory cells.

Although the disclosure has been more specifically illustrated and described in detail by means of the at least one example embodiment shown, the disclosure is not restricted thereto and other variations can be derived therefrom by a person skilled in the art without departing from the scope of protection of the disclosure.

The invention claimed is:

1. A method for determining a resultant data word when accessing memory cells of a memory, comprising:
   (a) reading a set of memory cells to obtain a physical value for each of a plurality of components,
   (b) determining a first data word from the set of memory cells by comparing for each component the respective physical value with a first reference value, and assigning to each component a first value if the physical value is above the first reference value and a second value if the physical value is below the first reference value,
   (c) determining a second data word from the set of memory cells by comparing for each component the respective physical value with a second reference value, and assigning to each component the first value if the physical value is above the second reference value and the second value if the physical value is below the second reference value,
   (d) determining if the first data word and if the second data word are codewords of an error correcting code;
   (e) when the first data word is a codeword of the error correcting code, adopting the first data word as the resultant data word; or
   (f) when the second data word is a codeword of the error correcting code, adopting the second data word as the resultant data word.

2. The method as claimed in claim 1, wherein each of the components is a single bit taking a binary value.

3. The method as claimed in claim 1,
   wherein when neither the first data word nor the second data word are codewords of the error correcting code,
   the resultant data word is determined by the first data word when the first data word can be corrected by using the error correcting code, or
   the resultant data word is determined by the second data word when the second data word can be corrected by using the error correcting code.

4. The method as claimed in claim 3, wherein a specified action is performed when neither the error of the first data word nor the error of the second data word cannot be corrected by means of the error correcting code.

5. The method as claimed in claim 1, further comprising:
   determining a third data word from the read set of memory cells by comparing for each component the respective physical value with a third reference value, and assigning to each component a first value when the physical value is above the third reference value and a second value when the physical value is below the third reference value.

6. The method as claimed in claim 1, wherein, when conditions according to neither feature (e) nor feature (f) are satisfied, the components of the resultant data word for the respective set of memory cells are set in dependence on a comparison with a further reference value.

7. The method as claimed in claim 5,
   wherein the resultant data word is determined on the basis of the first data word, the second data word and the third data word.

8. The method as claimed in claim 7, wherein a fourth data word is determined as an XOR operation combining the components of the first, second and third data words.

9. The method as claimed in claim 1, wherein, in dependence on previously determined errors, at least one of the first reference value or the second reference value is not used in a further reading of memory cells.

10. The method as claimed in claim 1, wherein different read-out memory cells or groups of memory cells are at least partially compared with different reference values.

11. The method as claimed in claim 1, wherein the reading of the set of memory cells takes place after an initialization or a switching on.

12. The method as claimed in claim 1, wherein the physical value obtained for each memory cell has a time dependence and is compared in a time domain with at least one of the first reference value or the second reference value.

13. The method as claimed in claim 1, further comprising classifying the memory cells with regard to their reliability on the basis of whether the first and second data words are codewords of the error correcting code.

14. A device for determining a resultant data word when accessing memory cells of a memory, wherein the device is designed for carrying out the steps of:

(a) reading a set of memory cells to obtain a physical value for each of a plurality of components,
(b) determining a first data word from the set of memory cells by comparing for each component the respective physical value with a first reference value, and assigning to each component a first value when the physical value is above the first reference value and a second value when the physical value is below the first reference value,
(c) determining a second data word from the set of memory cells by comparing for each component the respective physical value with a second reference value, and assigning to each component a first value when the physical value is above the second reference value and a second value when the physical value is below the second reference value,
(d) determining whether the first data word and the second data word are codewords of an error correcting code;
(e) when the first data word is a codeword of the error correcting code, adopting the first data word as the resultant data word; or
(f) when the second data word is a codeword of the error correcting code, adopting the second data word as the resultant data word.

* * * * *